United States Patent
Nanan et al.

(10) Patent No.: US 9,515,623 B2
(45) Date of Patent: Dec. 6, 2016

(54) MULTIPLE-STATE, SWITCH-MODE POWER AMPLIFIER SYSTEMS AND METHODS OF THEIR OPERATION

(71) Applicant: FREESCALE SEMICONDUCTOR, INC., Austin, TX (US)

(72) Inventors: Jean-Christophe Nanan, Toulouse (FR); Jean-Jacques Bouny, Fontenilles (FR); Cedric Cassan, Auterive (FR); Joseph Staudinger, Gilbert, AZ (US); Hugues Beaulaton, Toulouse (FR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/559,895

(22) Filed: Dec. 3, 2014

(65) Prior Publication Data

US 2015/0155840 A1    Jun. 4, 2015

(30) Foreign Application Priority Data

Dec. 3, 2013    (EP) .................................... 13306658

(51) Int. Cl.
*H03F 3/68* (2006.01)
*H03F 3/217* (2006.01)
(Continued)

(52) U.S. Cl.
CPC ............ *H03F 3/2178* (2013.01); *H03F 3/189* (2013.01); *H03F 3/211* (2013.01); *H03F 3/2171* (2013.01);
(Continued)

(58) Field of Classification Search
CPC ....................................................... H03F 3/68
(Continued)

(56) References Cited

U.S. PATENT DOCUMENTS 4,994,760 A    2/1991    Roehrs
6,741,483 B1*  5/2004    Stanley ............... H02M 7/4807
                                                 330/9

(Continued)

FOREIGN PATENT DOCUMENTS

DE    102011012622 A1    8/2012
WO    2011129727 A1    10/2011
WO    2013094265 A1    6/2013

OTHER PUBLICATIONS

Doherty, W.H., "A New High Efficiency Power Amplifier for Modulated Waves", Technical Papers, Proceedings of the Institute of Radio Engineers, vol. 24, No. 9, Sep. 1936, pp. 1163-1182.

(Continued)

*Primary Examiner* — Patricia T Nguyen
(74) *Attorney, Agent, or Firm* — Sherry W. Schumm

(57) ABSTRACT

An embodiment of an amplifier includes N (N>1) switch-mode power amplifier (SMPA) branches. Each SMPA branch includes two drive signal inputs and one SMPA branch output. A module coupled to the amplifier samples an input RF signal, and produces combinations of drive signals based on the samples. When an SMPA branch receives a first combination of drive signals, it produces an output signal at a first voltage level. Conversely, when the SMPA branch receives a different second combination of drive signals, it produces the output signal at a different second voltage level. Finally, when the SMPA branch receives a different third combination of drive signals, it produces the output signal at a voltage level of substantially zero. A combiner combines the output signals from all of the SMPA branches to produce a combined output signal that may have, at any given time, one of 2*N+1 quantization states.

21 Claims, 4 Drawing Sheets

(51) Int. Cl.
| | |
|---|---|
| H03F 3/189 | (2006.01) |
| H03F 3/21 | (2006.01) |
| H03F 3/24 | (2006.01) |
| H03F 3/30 | (2006.01) |
| H03F 3/60 | (2006.01) |
| H03F 3/72 | (2006.01) |
| H03M 1/06 | (2006.01) |
| H03M 1/78 | (2006.01) |

(52) U.S. Cl.
CPC .......... *H03F 3/2175* (2013.01); *H03F 3/2176* (2013.01); *H03F 3/245* (2013.01); *H03F 3/30* (2013.01); *H03F 3/604* (2013.01); *H03F 3/72* (2013.01); *H03M 1/0682* (2013.01); *H03F 2200/09* (2013.01); *H03F 2200/537* (2013.01); *H03F 2200/541* (2013.01); *H03F 2203/21106* (2013.01); *H03F 2203/21142* (2013.01); *H03F 2203/21145* (2013.01); *H03F 2203/21157* (2013.01); *H03M 1/78* (2013.01)

(58) Field of Classification Search
USPC .................. 330/124 R, 295, 147, 251, 207 A
See application file for complete search history.

(56) References Cited

U.S. PATENT DOCUMENTS

| | | | |
|---|---|---|---|
| 2002/0149425 A1 | 10/2002 | Chawla et al. | |
| 2003/0102915 A1* | 6/2003 | Wight | H03F 3/211 330/207 A |
| 2004/0239416 A1 | 12/2004 | Smiley et al. | |
| 2006/0006949 A1* | 1/2006 | Burns | H03F 3/211 330/301 |
| 2009/0167434 A1 | 7/2009 | Elmala | |
| 2009/0201084 A1* | 8/2009 | See | H03F 1/0244 330/51 |
| 2009/0273397 A1 | 11/2009 | Bockelman et al. | |
| 2010/0001796 A1 | 1/2010 | Sivakumar et al. | |
| 2013/0043944 A1* | 2/2013 | Jones | H03F 1/0227 330/124 R |
| 2013/0057343 A1 | 3/2013 | Kondo | |
| 2013/0082772 A1 | 4/2013 | Seddighrad et al. | |
| 2014/0132352 A1 | 5/2014 | Hansen | |
| 2014/0227988 A1 | 8/2014 | Sato et al. | |
| 2014/0295781 A1 | 10/2014 | Kawano | |
| 2015/0303961 A1* | 10/2015 | Banerjee | H04B 1/1615 375/287 |

OTHER PUBLICATIONS

Raab, F.H., "Efficiency of Doherty RF power-amplifier systems", IEEE Transactions on Broadcasting, vol. BC-33, No. 3, Sep. 1987, pp. 77-83.

EP Application 13306658.9, Extended European Search Report, mailed May 28, 2014.

* cited by examiner

| 400 | CONTROL BIT NUMBER | | | | | | | |
|---|---|---|---|---|---|---|---|---|
| | 1 | 2 | 3 | 4 | 5 | 6 | 7 | 8 |
| 401 STATE 1 | 1 | 0 | 1 | 0 | 1 | 0 | 1 | 0 | ⇒ +4
| 402 STATE 2 | 1 | 0 | 1 | 0 | 1 | 0 | 0 | 0 | ⇒ +3
| 403 STATE 3 | 1 | 0 | 1 | 0 | 0 | 0 | 0 | 0 | ⇒ +2
| 404 STATE 4 | 1 | 0 | 0 | 0 | 0 | 0 | 0 | 0 | ⇒ +1
| 405 STATE 5 | 0 | 0 | 0 | 0 | 0 | 0 | 0 | 0 | ⇒ 0
| 406 STATE 6 | 0 | 1 | 0 | 0 | 0 | 0 | 0 | 0 | ⇒ -1
| 407 STATE 7 | 0 | 1 | 0 | 1 | 0 | 0 | 0 | 0 | ⇒ -2
| 408 STATE 8 | 0 | 1 | 0 | 1 | 0 | 1 | 0 | 0 | ⇒ -3
| 409 STATE 9 | 0 | 1 | 0 | 1 | 0 | 1 | 0 | 1 | ⇒ -4

411 412 413 414 415 516 417 418

MULTIPLE-STATE, SWITCH-MODE POWER AMPLIFIER SYSTEMS AND METHODS OF THEIR OPERATION

TECHNICAL FIELD

Embodiments relate generally to switch-mode power amplifiers and methods of their operation.

BACKGROUND

Wireless radio frequency (RF) communication essentially involves the conversion of digital baseband information into a high-power, modulated RF signal that is suitable for transmission and reception over an air interface. In any RF communication system, the system's power amplifier plays an essential role in amplifying a signal to be communicated prior to provision of the signal to an antenna for transmission. Various common types of power amplifiers are used in RF communications, with the most common types being classified as having analog designs (e.g., classes A, B, AB, and C) or switching designs (e.g., classes D and E).

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase. However, amplifier performance also is important to consider, and many amplifier designs with high theoretical efficiencies may have characteristically lower performance. For example, some classes of amplifiers having relatively high theoretical efficiencies may have relatively poor performance in terms of linearity, distortion, bandwidth, and so on. As there is a great desire to optimize both efficiency and performance in an RF power amplifier, designers of RF power amplifiers continue to strive to develop more efficient and higher performing amplifier designs.

DETAILED DESCRIPTION

Embodiments described herein include switch-mode power amplifier (SMPA) systems and methods of their operation, which are configured to amplify a time varying signal, such as a radio frequency (RF) signal. Essentially, the SMPA system embodiments described herein implement an RF digital-to-analog converter (DAC) function. More specifically, the SMPA system embodiments described herein may be particularly suitable for use within a communication system in which an RF signal is oversampled and quantized prior to being encoded in order to drive multiple parallel SMPA branches. Each SMPA branch is configured to convert a direct current (DC) input voltage into an amplified output signal based on the drive signals that are provided to SMPAs (e.g., transistors) of the SMPA branch. The SMPA system further combines the output signals from the multiple SMPA branches, in order to produce an output RF signal with a voltage level that may be modulated between a plurality of voltage levels or states. The resulting output RF signal may be reconstructed with a reconstruction filter.

As will be explained in more detail below, the number, N, of SMPA "branches" utilized in the SMPA system defines the number, M, of output signal quantization states. More specifically, the number, M, of output signal quantization states is equal to at least 2*N+1, in an embodiment. According to various embodiments, N may be any integer greater than 1, although N also (although potentially less usefully) could be as small as 1, as well. For example, when N=2, an embodiment of an SMPA system is capable of producing an output signal having at least 5 distinct quantization states. Similarly, when N=3, an embodiment of an SMPA system is capable of producing an output signal having at least 7 distinct quantization states, when N=4, an embodiment of an SMPA system is capable of producing an output signal having at least 9 distinct quantization states, and so on. The number of SMPA branches may be considered to be arbitrary. A higher number of branches may be advantageous because it may result in higher coding efficiency. However, a system with a higher number of branches would be, by its nature, larger and more complex than a system with a lower number of branches. In any event, the inventive subject matter is intended to include embodiments of a system with any number of SMPA branches.

Figure 1:
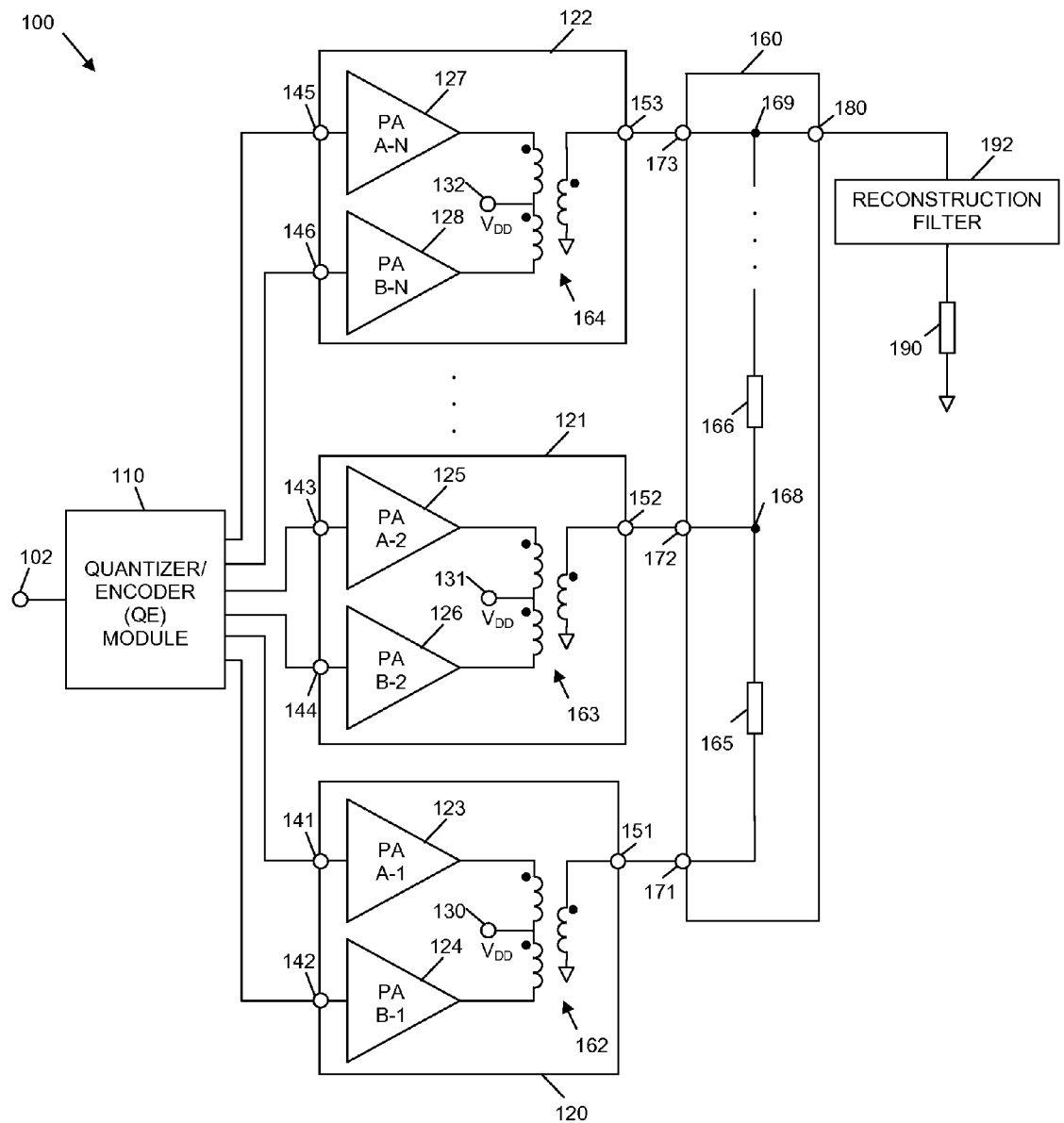
FIG. 1 is a simplified schematic diagram of multiple-state, switch-mode power amplifier (SMPA) system, in accordance with an example embodiment.
Figure 2:
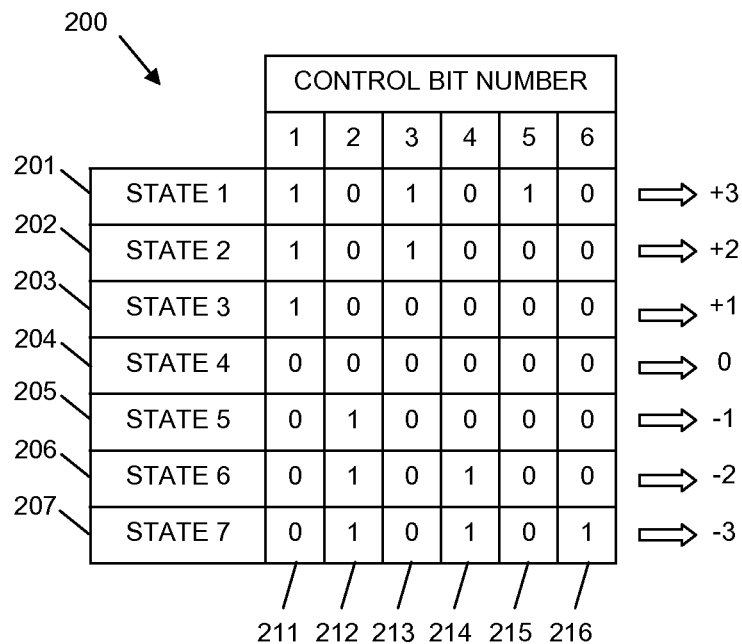
FIG. 2 is a table illustrating a first example of amplifier control bit codes which, when provided to an embodiment of a three-branch SMPA system, cause the SMPA system to amplitude modulate its output signal to one of seven output voltage levels.
Figure 3:
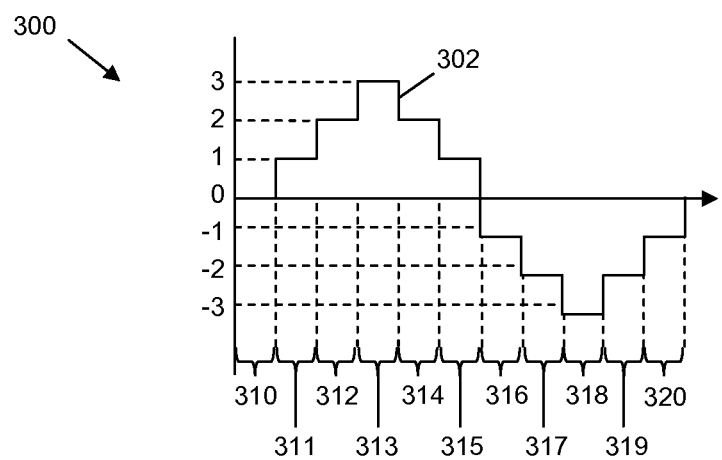
FIG. 3 is a chart illustrating seven example output voltage levels for a three-branch SMPA system, in accordance with an example embodiment.

FIG. 1 is a simplified schematic diagram of multiple-state SMPA system 100, in accordance with an example embodiment. SMPA system 100 includes a quantizer/encoder (QE) module 110, N SMPA branches 120, 121, 122, an output combiner 160, and a reconstruction filter 192. As will be explained in more detail below, each SMPA branch 120-122 may be implemented in the form of a class-D, push-pull amplifier, in an embodiment. More specifically, the circuit topology of the embodiment of the SMPA branches 120-122 illustrated in FIG. 1 is consistent with a typical voltage-mode class-D amplifier. However, as will be described in more detail below, the input signal drive is different from the conventional input signal drive for a class-D amplifier. Although FIG. 1 illustrates SMPA system 100 as including three SMPA branches 120-122 (N=3), it is to be understood that other embodiments of SMPA systems may include more or less than three SMPA branches. In order to describe a clear example of an embodiment of an SMPA system, FIGS. 1-3 are described in conjunction with a three-branch SMPA system (e.g., SMPA system 100, FIG. 1). However, those of skill in the art would understand, based on the description herein, that N may be any practical integer (e.g., an integer between 2 and 10, inclusive, although N could be greater than 10, as well).

QE module 110 is configured to receive an RF input signal at input node 102, and to sample the signal in order to produce a sequence of samples. For example, QE module 110 may be configured to periodically sample the magnitude of the voltage of the input RF signal, and to produce samples (at a sampling rate) that indicate the measured RF signal magnitudes. Alternatively, QE module 110 may be configured to sample the voltage of the input RF signal. Either way, QE module 110 is essentially configured to sample the input RF signal at the sampling rate. According to an embodiment, the sampling rate is higher than the fundamental frequency of the RF signal. More specifically, the sampling rate is selected to be high enough at least to satisfy the Nyquist sampling criterion. According to a specific embodiment, the sampling rate is about 4 times the fundamental frequency of the RF signal. In alternate embodiments, the sampling rate may be higher or lower (e.g., as low as twice the fundamental frequency). QE module 110 may perform the sampling, for example, using an analog-to-digital converter (ADC), such as a sigma-delta ADC, although other types of ADCs could be used, as well.

According to an embodiment, QE module 110 is further configured to quantize the samples within the sequence of samples in order to produce a sequence of quantized digital values, where the number of quantization states for the quantized digital values corresponds to the number of output signal quantization states (e.g., at least 2*N+1, in an embodiment). QE module 110 is further configured to encode each quantized digital value in order to produce a multi-bit encoded value in which each bit corresponds to a drive signal for a distinct one of the system's power amplifiers (PAs) 123-128. Accordingly, in system 100, which includes three SMPA branches 120-122 and six corresponding PAs 123-128, each encoded value may include at least six bits. The drive signals corresponding to each encoded value are provided substantially in parallel to drive signal inputs 141-146 of SMPA branches 120-122. According to an embodiment, and as will be explained in more detail later, the drive signals may have phase offsets when provided to the drive signal inputs 141-146, in order to compensate for phase shifts later applied by phase transformers 165, 166, and phase shifts arising within the output combiner 160, and the term "substantially in parallel" is intended to reflect that provision of the drive signals may be offset in phase.

Each SMPA branch 120-122 includes a complementary pair of PAs (i.e., pair 123, 124, pair 125, 126, and pair 127, 128). Each of the PAs 123-128 may include, for example, one or more field effect transistors (FETs) (e.g., metal oxide semiconductor FETs (MOSFETs)) or bipolar transistors. Herein, the PAs 123-128 in each pair are distinguished from each other using the designations "A" and "B". Further, the PAs 123-128 in different SMPA branches 120-122 are distinguished from each other herein using the designations "-1", "-2", and "-N". Accordingly, for example, the two PAs 123, 124 of the first PA branch 120 are designated as "PA A-1" 123 and "PA B-1" 124, the two PAs 125, 126 of the second PA branch 121 are designated as "PA A-2" 125 and "PA B-2" 126, and the two PAs 127, 128 of the Nth PA branch 120 are designated as "PA A-N" 127 and "PA B-N" 128. Furthermore, although each PA 123-128 is indicated as including a single amplifier stage, each PA 123-128 may be implemented with multiple serial connected amplifier stages in order to reach a desired output power level (e.g. including a pre-amplifier and a final amplifier), in various embodiments.

Each PA 123-128 is coupled between one of two drive signal inputs 141-146 and one of two PA output nodes (not labeled) associated with an SMPA branch 120-122. More specifically, as illustrated in FIG. 1, a first SMPA branch 120 includes PA A-1 123 coupled between drive signal input 141 and a first PA output node, and PA B-1 124 coupled between drive signal input 142 and a second PA output node. Similarly, a second SMPA branch 121 includes PA A-2 125 coupled between drive signal input 143 and a third PA output node, and PA B-2 126 coupled between drive signal input 144 and a fourth PA output node. Finally, an Nth (e.g., third) SMPA branch 122 includes PA A-N 127 coupled between drive signal input 145 and a fifth PA output node, and PA B-N 128 coupled between drive signal input 146 and a sixth PA output node. In addition, each SMPA branch 120-122 receives a DC voltage, $V_{DD}$, through a DC voltage input 130, 131, 132.

According to an embodiment, the PAs 123, 124 in SMPA branch 120 are of equal size, the PAs 125, 126 in SMPA branch 121 are of equal size, and the PAs 127, 128 in SMPA branch 122 are of equal size. However, the sizes of the PAs 123-128 in different SMPA branches 120-122 are different from each other, in an embodiment. For example, the relative size ratios of PAs 123-128 may be as follows: a) $Size_{PA\ A-1\ 123}=Size_{PA\ B-1\ 124}=1$; b) $Size_{PA\ A-2\ 125}=Size_{PA\ B-2\ 126}=2$; and c) $Size_{PA\ A-N\ 127}=Size_{PA\ B-N\ 128}=3/2$. In other words, the PAs 125, 126 in SMPA branch 121 are twice the size of the PAs 123, 124 in SMPA branch 120, and the PAs 127, 128 in SMPA branch 122 are 1.5 times the size of the PAs 123, 124 in SMPA branch 120. In alternate embodiments, the size ratios of the PAs 123-128 may be different from the above given example, or the PAs 123-128 in different SMPA branches 120-122 may be equal in size.

According to an embodiment, each SMPA branch 120-122 has a class D amplifier structure, as illustrated in FIG. 1. More specifically, each SMPA branch 120-122 includes a pair of PAs 123-128, as discussed above, along with a tapped transformer 162, 163, 164 (e.g., a center tapped transformer or balun). According to an embodiment, each transformer 162-164 includes a center-tapped, first coil with a first terminal coupled to the output of a first one of the PAs 123, 125, 127 of each SMPA branch 120-122, and a second terminal coupled to the output of a second one of the PAs 124, 126, 128 of each SMPA branch 120-122. In addition, each transformer 162-164 includes a second coil that is inductively coupled with the first coil, and that includes a first terminal coupled to an SMPA branch output 151, 152, 153 of each SMPA branch 120-122, and a second terminal coupled to a voltage reference (e.g., ground). The turn ratio of each transformer 162-164 is selected to produce a desired output voltage at SMPA branch outputs 151-153. For example, the turn ratio may be 2:1 or some other ratio. In addition, each input DC voltage supplied to the SMPA branches 120-122 through the voltage inputs 130-132 is provided at the center tap of the first coil of the transformer 162-164, in an embodiment.

According to an embodiment, the transistor(s) of each PA 123-128 are not operated in the linear region, but rather are either operated in the saturation region (or switched completely "on") or inactive (or switched completely "off") via the drive signals supplied to the drive signal inputs 141-146. Further, the PAs 123-128 of each SMPA branch 120-122 are operated as a push-pull pair, and the voltage of the output signal produced at SMPA branch outputs 151-153 depends upon the states of the drive signals to the PAs 123-128 (i.e., the drive signals provided at drive signal inputs 141-146) and the magnitude of the input DC voltage supplied through the voltage inputs 130-132. More specifically, in an embodiment, PAs 123-128 are driven so that either both PAs in an SMPA branch 120-122 are essentially off, thus producing substantially zero voltage at an SMPA branch output 151-153, or one of the PAs in the SMPA branch 120-122 is essentially off while the other PA in the SMPA branch 120-122 is operating in the saturation region (i.e., completely "on"), thus producing either a positive voltage signal or a negative voltage signal (depending on which PA is being driven) at SMPA branch output 151-153. For example, when one of the "A" PAs (e.g., one of PAs 123, 125, 127) is driven into saturation (while the "B" PA 124, 126, 128 in the pair is not driven), the SMPA branch 120-122 will produce an output signal having a positive normalized voltage. Conversely, when one of the "B" PAs (e.g., one of PAs 124, 126, 128) is driven into saturation (while the "A" PA 123, 125, 126 in the pair is not driven), the SMPA branch 120-122 will produce an output signal having a negative normalized voltage. Finally, when neither the "A" nor "B" PA 121-128 is driven, the SMPA branch 120-122 will produce an output signal having a substantially zero voltage.

For ease of description, each drive signal (e.g., the signal provided at one of drive signal inputs 141-146) is described herein as having one of two voltage levels or states at any given time: 1) a first state, $S_{OFF}$, corresponding to a drive signal that will cause a transistor of a PA to which it is supplied to be substantially non-conducting, or fully "off"; and 2) a second state, $S_{ON}$, corresponding to a drive signal that will cause a transistor of a PA to which it is supplied to be operating in the saturation region, or substantially conducting, or fully "on." In addition, the voltage of each output signal (e.g., the voltage of each signal at an SMPA branch output 151-153) may be indicated with a normalized value, which indicates that the voltage is either: 1) substantially zero ("0"); 2) a positive voltage level ("1"); or 3) a negative voltage level ("−1"). Table 1, below, is a truth table indicating combinations of drive signal values supplied to two drive signal inputs (e.g., drive signal inputs 141 and 142) of a single SMPA branch (e.g., SMPA branch 120) and the corresponding normalized voltage output value that would be produced by the SMPA branch at its SMPA branch output (e.g., SMPA branch output 151), according to an embodiment.

TABLE 1

Truth table for SMPA drive signals vs. normalized output voltage

| Drive signal 1 (e.g., at input 141) | Drive signal 2 (e.g., at input 142) | Normalized output voltage (e.g., at output 151) |
|---|---|---|
| $S_{OFF}$ | $S_{OFF}$ | 0 |
| $S_{ON}$ | $S_{OFF}$ | 1 |
| $S_{OFF}$ | $S_{ON}$ | −1 |

As discussed previously, QE module 110 oversamples an input RF signal to produce a sequence of samples, quantizes each sample to produce a sequence of quantized digital values, and encodes each quantized digital value in order to produce a multi-bit encoded value in which each bit corresponds to a drive signal for a distinct one of the system's PAs 123-128. For example, for a six-bit encoded value, a first bit (e.g., the most significant bit (MSB)) may correspond to a drive signal for drive signal input 141 (and thus "A" PA 123), a second bit (e.g., the adjacent bit of lesser significance) may correspond to a drive signal for drive signal input 142 (and thus "B" PA 124), a third bit (e.g., the next adjacent bit of lesser significance) may correspond to a drive signal for drive signal input 143 (and thus "A" PA 125), a fourth bit (e.g., the next adjacent bit of lesser significance) may correspond to a drive signal for drive signal input 144 (and thus "B" PA 126), a fifth bit (e.g., the next adjacent bit of lesser significance) may correspond to a drive signal for drive signal input 145 (and thus "A" PA 127), and a sixth bit (e.g., the least significant bit (LSB)) may correspond to a drive signal for drive signal input 146 (and thus "B" PA 128). Other encoded value bit-to-drive signal mappings may also be used, although the above mapping will be used herein for the purpose of example.

During operation of system 100, the combination of drive signals provided by QE module 110 in parallel to drive signal inputs 141-146 are defined by an encoded value that is next to be processed by the system 100. More specifically, for example, QE module 110 may generate a sample, quantize the sample to produce a quantized digital value, and convert the quantized digital value into a particular encoded value (e.g., a 6-bit value) that corresponds to the magnitude of the quantized digital value. QE module 110 may then generate the drive signals according to the encoded value. For example, when QE module 110 is generating drive signals based on an encoded value of "1 0 1 0 1 0", with the bits corresponding to one of the drive signals provided to drive signal inputs 141-146, the drive signals may have the following states: $S_{ON}$ (drive signal for drive signal input 141); $S_{OFF}$ (drive signal for drive signal input 142); $S_{ON}$ (drive signal for drive signal input 143); $S_{OFF}$ (drive signal for drive signal input 144); $S_{ON}$ (drive signal for drive signal input 145); and $S_{OFF}$ (drive signal for drive signal input 146). Provision of such a combination of drive signals will cause "A" PAs 123, 125, 127 to produce a relatively high voltage output signal, and will result in "B" PAs 124, 126, 128 essentially producing zero voltage output signals.

Although FIG. 1 illustrates a particular class D amplifier topology that may be used in conjunction with the SMPA system 100 illustrated in FIG. 1, those of skill in the art would understand, based on the description herein, that other class D amplifier topologies alternatively could be used. In addition, the SMPA system 100 alternatively may utilize class E amplifier topologies or other types of switching amplifiers.

As discussed previously, SMPA system 100 also includes an output combiner 160. The output combiner 160 includes a plurality of inputs 171, 172, 173, each coupled to one of the SMPA branch outputs 151-153 of the SMPA branches 120-122. The output combiner 160 is configured to combine the signals received from the SMPA branches 120-122 via the SMPA branch outputs 151-153 and combiner inputs 171-173, in order to produce a combined output signal at output 180. The combined output signal is provided to reconstruction filter 192, in an embodiment, which includes a band-pass filter configured to bandlimit the combined output signal (e.g., to produce a smoother output analog RF signal by filtering out the out-of-band spectral content). When the reconstruction filter 192 is coupled to a load 190, as shown in FIG. 1, the reconstructed output signal produced by the reconstruction filter 192 is provided to the load 190.

According to an embodiment, output combiner 160 includes a number of summing nodes 168, 169 and a number of phase transformers 165, 166, which may be coupled to the combiner inputs 171-173 as indicated in FIG. 1. For example, the number of summing nodes 168, 169 may equal N−1, and the number of phase transformers 165, 166 may equal N−1, although the number of summing nodes 168, 169 and/or phase transformers 165, 166 may be different, in other embodiments. In the illustrated embodiment, the first SMPA branch 120 is coupled (via output 151 and input 171) to a first terminal of a first phase transformer 165, the second SMPA branch 121 is coupled (via output 152 and input 172) to summing node 168, a second terminal of the first phase transformer 165, and a first terminal of a second phase transformer 166, and the Nth (e.g., third) SMPA branch 122 is coupled (via output 153 and input 173) to summing node 169 and a second terminal of the second phase transformer 166. Further, summing node 169 is coupled to output 180.

Phase transformers 165, 166 may be quarter wave (lambda/4) phase transformers, for example. Accordingly, each phase transformer 165, 166 may introduce a 90 degree phase delay to a signal received at its first terminal. In other embodiments, phase transformers 165, 166 may be configured to introduce larger or smaller phase delays. In addition to producing a phase shift, phase transformers 165, 166 may also be configured to produce impedance transformations between input 171 and summing node 168, and between summing nodes 168 and 169, respectively. Either way, the phasing of the drive signals provided to the SMPA branches 120-122 at drive signal inputs 141-146 is controlled so that signals received at summing nodes 168, 169 from different SMPA branches 120-122 will be added together in phase. For example, in an embodiment in which phase transformers 165, 166 are quarter wave transformers, QE module 110 provides drive signals corresponding to a particular encoded value (or to a particular sample or quantized digital value) to SMPA branch 120 90 degrees ahead of the drive signals provided to SMPA branch 121, and 180 degrees ahead of drive signals provided to SMPA branch 122. Accordingly, the output signal from SMPA branch 120 will be delayed by phase transformer 165 by 90 degrees, thus allowing that output signal to arrive at summing node 168 in phase with the output signal from SMPA branch 121. The combined signal at summing node 168 is again delayed by phase transformer 166 by another 90 degrees, thus allowing the combined signal from summing node 168 to arrive at summing node 169 in phase with the output signal from SMPA branch 122. In this manner, the output signals from all of the SMPA branches 120-122 ultimately are combined in phase with each other.

As will now be described in detail, embodiments of an SMPA system, such as SMPA system 100 described above, may be operated so that the SMPA system is capable of producing an output signal (e.g., at output 180) with a voltage level that may be modulated between a plurality of voltage levels or states. For example, in an SMPA system with N SMPA branches, the number, M, of output signal quantization states is equal to at least 2*N+1, in an embodiment. Each output quantization state corresponds to a different set of drive signals and, thus, to a different set of encoded values. In other words, according to an embodiment, a QE module (e.g., QE module 110) is configured to quantize each sample and thereafter encode each quantized digital value to one of M encoded values, and each of the M encoded values, when converted to drive signals, corresponds to production of an output signal (e.g., at output 180) having one of M output signal quantization states.

For example, FIGS. 2 and 3 correspond to systems with three SMPA branches (i.e., N=3) which are configured to produce output signals having any one of seven output quantization states (i.e., M=2*3+1=7). More specifically, FIG. 2 is a table 200 illustrating a first example of amplifier control bit codes which, when implemented in an embodiment of a three-branch SMPA system with six PAs, cause the SMPA system to amplitude modulate its output signal to one of seven output voltage levels or states.

Table 200 includes seven rows 201, 202, 203, 204, 205, 206, 207, where each row corresponds to one of seven quantization states (e.g., quantization states ranging from values of −3 to +3 in step sizes of 1). In addition, the table 200 includes six columns 211, 212, 213, 214, 215, 216, where each column corresponds to one bit of a six-bit encoded value, and the value of each bit determines the state of a drive signal that will be provided to one of the six PAs of the system. Said another way, each bit position of an encoded value corresponds to a different one of the six PAs, and the value of the bit in that bit position defines the drive signal that the QE module will provide to the corresponding PA. By way of example, column 211 may correspond to PA 123, column 212 may correspond to PA 124, column 213 may correspond to PA 125, column 214 may correspond to PA 126, column 215 may correspond to PA 127, and column 216 may correspond to PA 128.

In the example embodiments provided herein, the least significant bits of each encoded value (i.e., control bits 1 and 2 in Table 2) correspond to the PAs that are electrically farthest from the output node (e.g., output 180), and the most significant bits of each encoded value (i.e., control bits 5 and 6 in Table 2) correspond to the PAs that are electrically closest to the output node. Further, in the example embodiments provided herein, odd numbered control bits correspond to "A" PAs (e.g., PAs 123, 125, 127), and even numbered control bits correspond to "B" PAs (e.g., PAs 124, 126, 128). Those of skill in the art would understand, based on the description herein, that the mapping of bits in an encoded value to PAs of a system may be different from the example mappings provided herein, and such alternative mappings are intended to be included within the scope of the inventive subject matter.

In any event, referring to FIG. 2, each row 201-207 includes one of seven unique encoded values, and each of the encoded values, when selected by the QE module and used to produce drive signals for the PAs, will cause the system to produce an output signal (e.g., at output 180) having one of seven different normalized voltage levels or states. For example, in table 200, encoded value "1 0 1 0 1 0" in row 201 may correspond to a highest quantization state (e.g., a positive voltage level of +3), encoded value "1 0 1 0 0 0" in row 202 may correspond to a next highest quantization state (e.g., a positive voltage level of +2), encoded value "1 0 0 0 0 0" in row 203 may correspond to a next highest quantization state (e.g., a positive voltage level of +1), encoded value "0 0 0 0 0 0" in row 204 may correspond to a neutral or zero quantization state, encoded value "0 1 0 0 0 0" in row 205 may correspond to a next lowest quantization state (e.g., a negative voltage level of −1), encoded value "0 1 0 1 0 0" in row 206 may correspond to a next lowest quantization state (e.g., a negative voltage level of −2), and encoded value "0 1 0 1 0 1" in row 207 may correspond to the lowest quantization state (e.g., a negative voltage level of −3).

As mentioned previously, a QE module periodically samples an input RF signal (e.g., a signal received at input 102) to produce a sequence of samples that are indicative of the voltage of the RF signal at each of the sampling times. The QE module further quantizes each sample to produce a corresponding quantized digital value, and selects an encoded value (e.g., one of the encoded values in table 200) corresponding to each quantized digital value. For example, the encoded value in row 201 may be selected for one or more first quantized digital values (e.g., corresponding to samples falling within a first, highest range of magnitudes), the encoded value in row 202 may be selected for one or more second quantized digital values (e.g., corresponding to samples falling within a lower adjacent range of magnitudes), and so on.

After an encoded value has been selected, it may be converted into drive signals for driving the system's PAs.

For example, each "0" in an encoded value may correspond to a drive signal having a magnitude of $S_{OFF}$, and each "1" in an encoded value may correspond to a drive signal having a magnitude of $S_{ON}$. The QE module may then provide the drive signals to the corresponding PAs (e.g., in a phased manner, as discussed previously). For example, when the encoded value in row 201 is selected, the QE module may convert the encoded value of "1 0 1 0 1 0" into drive signals having magnitudes of $S_{ON}$ (to drive PA 123), $S_{OFF}$ (to drive PA 124), $S_{ON}$ (to drive PA 125), $S_{OFF}$ (to drive PA 126), $S_{ON}$ (to drive PA 127), and $S_{OFF}$ (to drive PA 128).

According to an embodiment, when any one of the "A" PAs (e.g., PAs 123, 125, 127) is provided with a drive signal with a state of $S_{ON}$ (while the corresponding "B" PA is provided with a drive signal with a state of $S_{OFF}$), the "A" PA will produce a signal that results in an output signal from its SMPA branch having a normalized voltage magnitude of +1. Conversely, when any one of the "B" PAs (e.g., PAs 124, 126, 128) is provided with a drive signal with a state of $S_{ON}$ (while the corresponding "A" PA is provided with a drive signal with a state of $S_{OFF}$), the "B" PA will produce a signal that results in an output signal from its SMPA branch having a normalized voltage magnitude of −1. Accordingly, when the PAs are driven with the drive signals corresponding to the encoded value in row 201, as listed above, each of the "A" PAs (e.g., PAs 123, 125, 127) will produce a signal that results in an output signal from its SMPA branch having a normalized voltage magnitude of +1, and the combiner network (e.g., output combiner 160) will sum the output signals in phase to produced a system output signal (e.g., at output 180) having a normalized voltage magnitude of +3. Conversely, if the PAs are driven with the drive signals corresponding to the encoded value in row 207 (i.e., drive signals $S_{OFF}$ (to drive PA 123), $S_{ON}$ (to drive PA 124), $S_{OFF}$ (to drive PA 125), $S_{ON}$ (to drive PA 126), $S_{OFF}$ (to drive PA 127), and $S_{ON}$ (to drive PA 128)), each of the "B" PAs (e.g., PAs 124, 126, 128) will produce a signal that results in an output signal from its SMPA branch having a normalized voltage magnitude of −1, and the combiner network will sum the output signals to produced a system output signal (e.g., at output 180) having a normalized voltage magnitude of −3.

FIG. 3 is a chart 300 illustrating seven example output voltage levels for a three-branch SMPA system, in accordance with an example embodiment. In chart 300, the vertical axis represents voltage level (normalized), and the horizontal axis represents time. In keeping with the previous example, the chart 300 depicts a varying magnitude of an output signal (e.g., at output 180) when a particular sequence of encoded values (e.g., a sequence of values from the encoded values of FIG. 2) is selected by a QE module. Referring to both FIGS. 2 and 3, trace 302 of chart 300 depicts the magnitude of the output signal (e.g., at output 180) when a QE module (e.g., QE module 110) converts the sequence of encoded values in the following table into drive signals that are provided to SMPA branches (e.g., SMPA branches 120-122), each SMPA branch produces a corresponding output signal, and a combiner (e.g., combiner 160) combines the output signals to produce a system output signal (e.g., at output 180):

| time period (FIG. 3) | row/encoded value (FIG. 2) | normalized output voltage |
|---|---|---|
| 310 | 204/0 0 0 0 0 0 | 0 |
| 311 | 203/1 0 0 0 0 0 | 1 |

-continued

| time period (FIG. 3) | row/encoded value (FIG. 2) | normalized output voltage |
|---|---|---|
| 312 | 202/1 0 1 0 0 0 | 2 |
| 313 | 201/1 0 1 0 1 0 | 3 |
| 314 | 202/1 0 1 0 0 0 | 2 |
| 315 | 203/1 0 0 0 0 0 | 1 |
| 316 | 205/0 1 0 0 0 0 | −1 |
| 317 | 206/0 1 0 1 0 0 | −2 |
| 318 | 207/0 1 0 1 0 1 | −3 |
| 319 | 206/0 1 0 1 0 0 | −2 |
| 320 | 205/0 1 0 0 0 0 | −1 |

The encoded values in table 200 are provided as examples only. Those of skill in the art would understand, based on the description herein, how to generate sets of encoded values that may be used in conjunction with SMPA systems with more or fewer than three SMPA branches (e.g., SMPA systems that may produce output signals with more or fewer than seven states). For example, an embodiment of an SMPA system with four SMPA branches (i.e., N=4) may be capable of producing output voltage with at least nine quantization states (i.e., M=2*4+1=9). In such an embodiment, a set of encoded values may include nine different eight-bit values in order to implement the nine different quantization states.

Figures 4, 5:
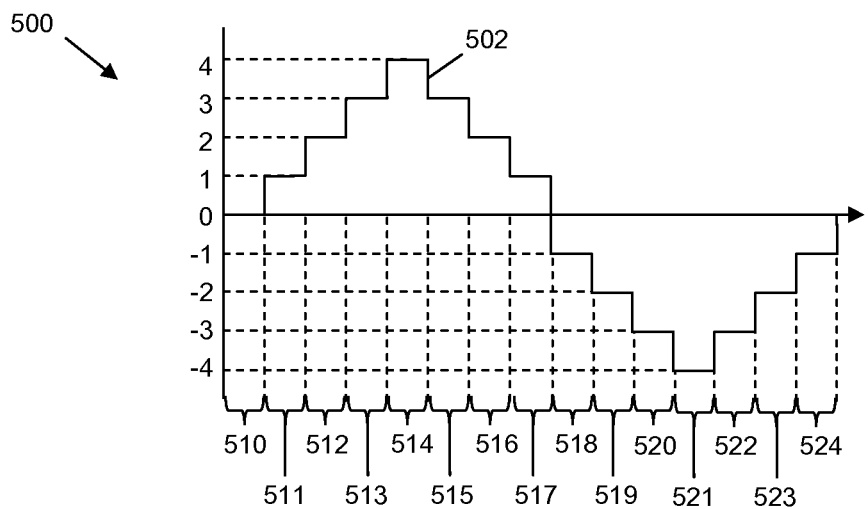
FIG. 4 is a table illustrating an example of amplifier control bit codes which, when provided to an embodiment of a four-branch SMPA system, cause the SMPA system to amplitude modulate its output signal to one of nine output voltage levels.
FIG. 5 is a chart illustrating nine example output voltage levels for a four-branch SMPA system, in accordance with an example embodiment.

FIG. 4 is a table 400 illustrating an example of amplifier control bit codes which, when provided to an embodiment of a four-branch SMPA system with eight PAs, cause the SMPA system to amplitude modulate its output signal to one of nine output voltage levels. Table 400 includes nine rows 401, 402, 403, 404, 405, 406, 407, 408, 409, where each row corresponds to one of nine quantization states (e.g., quantization states ranging from values of −4 to +4 in step sizes of 1). In addition, the table 400 includes eight columns 411, 412, 413, 414, 415, 416, 417, 418, where each column corresponds to one bit of an eight-bit encoded value, and the value of each bit determines the state of a drive signal that will be provided to one of the eight PAs of the system. Each row 401-409 includes one of nine unique encoded values, and each of the encoded values, when selected by a QE module (e.g., QE module 110), will cause the system to produce an output signal having one of nine different normalized voltage levels or states. For example, in table 400, encoded value "1 0 1 0 1 0 1 0" in row 401 may correspond to a highest quantization state (e.g., a positive voltage level of +4), encoded value "1 0 1 0 1 0 0 0" in row 402 may correspond to a next highest quantization state (e.g., a positive voltage level of +3), and so on.

FIG. 5 is a chart 500 illustrating nine example output voltage levels for a four-branch SMPA system, in accordance with an example embodiment. In chart 500, the vertical axis represents voltage level (normalized), and the horizontal axis represents time. Similar to chart 300, chart 500 depicts a varying magnitude of an output signal (e.g., at output 180) when a particular sequence of encoded values (e.g., a sequence of values from the encoded values of FIG. 4) is selected by a QE module. Referring also to FIG. 4, trace 502 of chart 500 depicts the magnitude of the output signal (e.g., at output 180) when a QE module (e.g., QE module 110) converts the sequence of encoded values in the following table into drive signals that are provided to SMPA branches (e.g., SMPA branches 120-122 when N=4), each SMPA branch produces a corresponding output signal, and a combiner (e.g., combiner 160) combines the output signals to produce a system output signal (e.g., at output 180):

| time period (FIG. 5) | row/encoded value (FIG. 4) | normalized output voltage |
|---|---|---|
| 510 | 405/0 0 0 0 0 0 0 0 | 0 |
| 511 | 404/1 0 0 0 0 0 0 0 | 1 |
| 512 | 403/1 0 1 0 0 0 0 0 | 2 |
| 513 | 402/1 0 1 0 1 0 0 0 | 3 |
| 514 | 401/1 0 1 0 1 0 1 0 | 4 |
| 515 | 402/1 0 1 0 1 0 0 0 | 3 |
| 516 | 403/1 0 1 0 0 0 0 0 | 2 |
| 517 | 404/1 0 0 0 0 0 0 0 | 1 |
| 518 | 406/0 1 0 0 0 0 0 0 | −1 |
| 519 | 407/0 1 0 1 0 0 0 0 | −2 |
| 520 | 408/0 1 0 1 0 1 0 0 | −3 |
| 521 | 409/0 1 0 1 0 1 0 1 | −4 |
| 522 | 408/0 1 0 1 0 1 0 0 | −3 |
| 523 | 407/0 1 0 1 0 0 0 0 | −2 |
| 524 | 406/0 1 0 0 0 0 0 0 | −1 |

Figure 6:
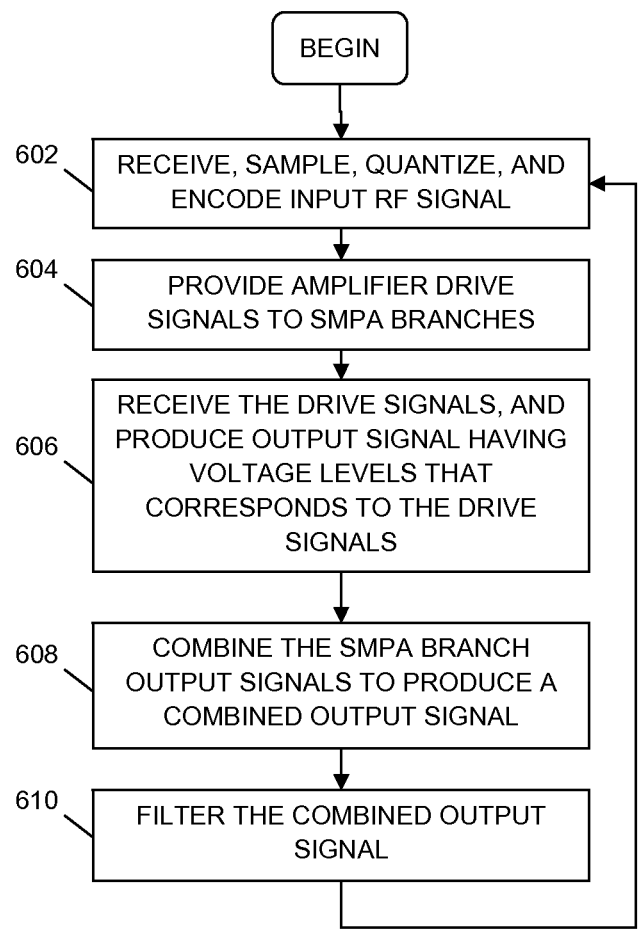
FIG. 6 is a flowchart of a method for operating a multiple-state SMPA system, in accordance with an example embodiment.

FIG. 6 is a flowchart of a method for operating a multiple-state SMPA system (e.g., SMPA system 100, FIG. 1), in accordance with an example embodiment. The method may begin, in block 602, when the SMPA system receives an RF signal. For example, referring also to FIG. 1, a QE module (e.g., QE module 110) may receive an RF signal provided at an input node (e.g., input node 102). The SMPA system (or more particularly, the QE module) may then sample the input RF signal, quantize the samples, and encode the quantized digital values. For example, as discussed previously, the SMPA system may periodically measure the magnitude of the input signal, and produce samples (at a sampling rate) that indicate the measured magnitudes. The SMPA system may then quantize each sample in order to produce a quantized digital value, and encode each quantized digital value in order to produce a multi-bit encoded value in which each bit corresponds to a drive signal for a distinct one of the system's PAs (e.g., PAs 123-128).

In block 604, the SMPA system (e.g., the QE module) may then produce amplifier drive signals based on each encoded value, and may provide the drive signals to the PAs of the system's SMPA branches (e.g., to PAs 123-128 of SMPA branches 120-122). As discussed previously, the state of each amplifier drive signal at any given time depends on the state of the encoded value bit that corresponds to each amplifier (e.g., the state of the drive signal is either $S_{OFF}$ or $S_{ON}$, depending on whether the bit is "0" or "1"). As also discussed previously, the amplifier drive signals may be provided to the amplifiers with phase offsets that ensure that, ultimately, the amplified RF signals are combined (e.g., by output combiner 160) in phase.

In block 606, the PAs of the system's SMPA branches (e.g., to PAs 123-128 of SMPA branches 120-122) receive the drive signals, and each SMPA branch produces an output signal that has a voltage level that corresponds to the drive signals. In block 608, the output signals produced by the SMPA branches are combined in phase (e.g., by output combiner 160), in order to produce a combined output signal (e.g., at output 180). The combined output signal may then be filtered (e.g., by reconstruction filter 192), in block 608, in order to bandlimit the combined output signal. Finally, the reconstructed output signal may be provided to a load (e.g., load 190). The method may be continuously performed as long as the SMPA system continues to operate.

An embodiment of an amplifier includes a number, N, of switch-mode power amplifier (SMPA) branches, wherein N is greater than one. Each SMPA branch includes two drive signal inputs, so that the amplifier has a total of 2*N drive signal inputs, and one SMPA branch output, so that the amplifier has a total of N SMPA branch outputs. In response to receiving a first combination of drive signals at the two drive signal inputs, each SMPA branch is configured to produce, at the SMPA branch output, an SMPA branch output signal at a first voltage level. Further, in response to receiving a different second combination of drive signals at the two drive signal inputs, each SMPA branch is configured to produce, at the SMPA branch output, the SMPA branch output signal at a different second voltage level.

Another embodiment of an amplifier includes a module with a radio frequency (RF) signal input and 2*N drive signal outputs, wherein N is greater than one, N SMPA branches, and a combiner. The module is configured to receive an input RF signal at the RF signal input, to sample the input RF signal, resulting in a sequence of samples, and to provide, at the 2*N drive signal outputs, drive signals to each of N SMPA branches. The states of the drive signals at any given time depend on the magnitude of a sample in the sequence of samples. Each SMPA branch includes two drive signal inputs, where each drive signal input is coupled to a different one of the 2*N drive signal outputs, and one SMPA branch output, so that the amplifier has a total of N SMPA branch outputs. In response to receiving a first combination of drive signals at the two drive signal inputs, each SMPA branch is configured to produce, at the SMPA branch output, an SMPA branch output signal at a first voltage level. In response to receiving a different second combination of drive signals at the two drive signal inputs, each SMPA branch is configured to produce, at the SMPA branch output, the SMPA branch output signal at a different second voltage level. The combiner includes N combiner inputs and a combiner output. Each of the combiner inputs is coupled to a different one of the N SMPA branch outputs, and the combiner is configured to combine together the SMPA branch output signal from all of the N SMPA branches to produce, at the combiner output, a combined output signal. The combined output signal may have, at any given time, one of 2*N+1 quantization states.

An embodiment of a method, performed by an amplifier, for amplifying a time varying signal includes receiving combinations of drive signals by a number, N, of SMPA branches of the amplifier, wherein N is greater than one, and each SMPA branch includes two drive signal inputs, so that the amplifier has a total of 2*N drive signal inputs, and one SMPA branch output, so that the amplifier has a total of N SMPA branch outputs. The method further includes, in response to receiving a first combination of drive signals at the two drive signal inputs, producing, by each SMPA branch at the SMPA branch output, an SMPA branch output signal at a first voltage level. The method further includes, in response to receiving a different second combination of drive signals at the two drive signal inputs, producing, by each SMPA branch at the SMPA branch output, the SMPA branch output signal at a different second voltage level.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus. The term "coupled," as used herein, is defined as directly or indirectly connected in an electrical or non-electrical manner.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An amplifier comprising:
a number, N, of switch-mode power amplifier (SMPA) branches, wherein N is greater than one, and wherein each SMPA branch includes
two drive signal inputs, so that the amplifier has a total of 2*N drive signal inputs, and
one SMPA branch output, so that the amplifier has a total of N SMPA branch outputs, and wherein,
in response to receiving a first combination of drive signals at the two drive signal inputs, each SMPA branch is configured to produce, at the SMPA branch output, an SMPA branch output signal at a first voltage level, and
in response to receiving a different second combination of drive signals at the two drive signal inputs, each SMPA branch is configured to produce, at the SMPA branch output, the SMPA branch output signal at a different second voltage level; and
a module with a radio frequency (RF) signal input and 2*N drive signal outputs, wherein each of the 2*N drive signal outputs is coupled to one of the 2*N drive signal inputs, and the module is configured to receive an input RF signal at an RF signal input, to sample the input RF signal, resulting in a sequence of samples, and to provide, at the 2*N drive signal outputs, drive signals to each of the N SMPA branches, wherein the states of the drive signals at any given time depend on a magnitude of a sample in the sequence of samples.

2. The amplifier of claim 1, further comprising:
a combiner with N combiner inputs and a combiner output, wherein each of the combiner inputs is coupled to a different one of the N SMPA branch outputs, and the combiner is configured to combine together the SMPA branch output signal from all of the N SMPA branches to produce, at the combiner output, a combined output signal.

3. The amplifier of claim 2, wherein the combiner is configured to produce the combined output signal as a signal that is, at any given time, at one of 2*N+1 quantization states.

4. The amplifier of claim 3, wherein N=2, and the combiner is configured to produce the combined output signal as a signal that is, at any given time, at one of 5 quantization states.

5. The amplifier of claim 3, wherein N=3, and the combiner is configured to produce the combined output signal as a signal that is, at any given time, at one of 7 quantization states.

6. The amplifier of claim 3, wherein N=4, and the combiner is configured to produce the combined output signal as a signal that is, at any given time, at one of 9 quantization states.

7. The amplifier of claim 3, wherein N is an integer between 2 and 10, inclusive.

8. The amplifier of claim 2, wherein the combiner comprises:
N−1 summing nodes, wherein an output summing node of the N−1 summing nodes is coupled to the combiner output; and
N−1 phase transformers, wherein each phase transformer is coupled to a summing node and is also coupled between SMPA branch outputs of a different set of two adjacent SMPA branches, and wherein the phase transformer is configured to apply a phase delay to the SMPA branch output signal from the SMPA branch that is electrically farther from the output summing node so that the SMPA branch output signals from the two adjacent SMPA branches combine in phase at the summing node to which the phase transformer is coupled.

9. The amplifier of claim 2, further comprising:
a reconstruction filter coupled to the combiner output, wherein the reconstruction filter is configured to bandpass filter the combined output signal.

10. The amplifier of claim 1,
wherein the module is further configured to quantize each sample of the sequence of samples to produce a sequence of quantized digital values, to encode each quantized digital value to produce a sequence of encoded values, and to provide, at the 2*N drive signal outputs, the drive signals to each of the N SMPA branches, wherein the states of the drive signals at any given time depend on an encoded value that is being processed by the module.

11. The amplifier of claim 10, wherein each encoded value includes at least 2*N bits, each bit corresponds to a different one of the drive signals, and the value of each bit defines whether the drive signal to which the bit corresponds will have a first state, Son, corresponding to a drive signal that will cause a transistor of an SMPA branch to which the drive signal is supplied to be substantially non-conducting, or a second state, SoN, corresponding to a drive signal that will cause the transistor to operate in a saturation region.

12. The amplifier of claim 10, wherein the module is configured to determine, based on the magnitude of the sample, a combination of drive signals which, for each of the SMPA branches, will cause the SMPA branch either to produce the SMPA branch output signal at the first voltage level, to produce the SMPA branch output signal at the second voltage level, or to produce the SMPA branch output signal at a third voltage level of substantially zero voltage.

13. The amplifier of claim 2, wherein the combiner imposes phase delays on the SMPA branch output signals from at least some of the N SMPA branches, and the module is configured to provide the drive signals to the SMPA branches with phase offsets that compensate for the phase delays imposed by the combiner.

14. An amplifier comprising:
a module with a radio frequency (RF) signal input and 2*N drive signal outputs, wherein N is greater than one, and wherein the module is configured to receive an input RF signal at the RF signal input, to sample the input RF signal, resulting in a sequence of samples, and to provide, at the 2*N drive signal outputs, drive signals to each of N switch-mode power amplifier (SMPA) branches, wherein the states of the drive signals at any given time depend on the magnitude of a sample in the sequence of samples;
the N SMPA branches, wherein each SMPA branch includes
two drive signal inputs, wherein each drive signal input is coupled to a different one of the 2*N drive signal outputs, and
one SMPA branch output, so that the amplifier has a total of N SMPA branch outputs, and wherein,
in response to receiving a first combination of drive signals at the two drive signal inputs, each SMPA branch is configured to produce, at the SMPA branch output, an SMPA branch output signal at a first voltage level, and
in response to receiving a different second combination of drive signals at the two drive signal inputs, each SMPA branch is configured to produce, at the SMPA branch output, the SMPA branch output signal at a different second voltage level; and
a combiner with N combiner inputs and a combiner output, wherein each of the combiner inputs is coupled to a different one of the N SMPA branch outputs, and the combiner is configured to combine together the SMPA branch output signal from all of the N SMPA branches to produce, at the combiner output, a combined output signal, wherein the combined output signal may have, at any given time, one of 2*N+1 quantization states.

15. The amplifier of claim 14, wherein:
the module is further configured to determine an encoded value for each sample based on the magnitude of the sample,
each encoded value includes at least 2*N bits, wherein each bit corresponds to a different one of the drive signals, and the value of each bit defines whether the drive signal to which the bit corresponds will have a first state, $S_{OFF}$, corresponding to a drive signal that will cause a transistor of an SMPA branch to which the drive signal is supplied to be substantially non-conducting, or a second state, $S_{ON}$, corresponding to a drive signal that will cause the transistor to operate in a saturation region, and
each encoded value corresponds to a combination of drive signals which, for each of the SMPA branches, will cause the SMPA branch either to produce the SMPA branch output signal at the first voltage level, to produce the SMPA branch output signal at the second voltage level, or to produce the SMPA branch output signal at a third voltage level of substantially zero voltage.

16. An amplifier comprising:
a module with a radio frequency (RF) signal input and 2*N drive signal outputs, wherein N is greater than one, and wherein the module is configured to receive an input RF signal at the RF signal input, to sample the input RF signal, resulting in a sequence of samples, and to provide, at the 2*N drive signal outputs, drive signals to each of N switch-mode power amplifier (SMPA) branches, wherein the states of the drive signals at any given time depend on the magnitude of a sample in the sequence of samples;
the N SMPA branches, wherein each SMPA branch includes
two drive signal inputs, wherein each drive signal input is coupled to a different one of the 2*N drive signal outputs,
one SMPA branch output, so that the amplifier has a total of N SMPA branch outputs, and
a class-D, push-pull amplifier that includes two SMPAs and a center-tapped transformer, wherein an input of each of the SMPAs is coupled to a different one of the two drive signal inputs, and an output of each of the SMPAs is coupled to a different end of a first coil of the center-tapped transformer, and wherein a second coil of the center-tapped transformer is coupled to the SMPA branch output, and wherein,
in response to receiving a first combination of drive signals at the two drive signal inputs, each SMPA branch is configured to produce, at the SMPA branch output, an SMPA branch output signal at a first voltage level, and
in response to receiving a different second combination of drive signals at the two drive signal inputs, each SMPA branch is configured to produce, at the SMPA branch output, the SMPA branch output signal at a different second voltage level; and
a combiner with N combiner inputs and a combiner output, wherein each of the combiner inputs is coupled to a different one of the N SMPA branch outputs, and the combiner is configured to combine together the SMPA branch output signal from all of the N SMPA branches to produce, at the combiner output, a combined output signal, wherein the combined output signal may have, at any given time, one of 2*N+1 quantization states.

17. An amplifier comprising:
a module with a radio frequency (RF) signal input and 2*N drive signal outputs, wherein N is greater than one, and wherein the module is configured to receive an input RF signal at the RF signal input, to sample the input RF signal, resulting in a sequence of samples, and to provide, at the 2*N drive signal outputs, drive signals to each of N switch-mode power amplifier (SMPA) branches, wherein the states of the drive signals at any given time depend on the magnitude of a sample in the sequence of samples;
the N SMPA branches, wherein each SMPA branch includes
two drive signal inputs, wherein each drive signal input is coupled to a different one of the 2*N drive signal outputs, and
one SMPA branch output, so that the amplifier has a total of N SMPA branch outputs, and wherein,
in response to receiving a first combination of drive signals at the two drive signal inputs, each SMPA branch is configured to produce, at the SMPA branch output, an SMPA branch output signal at a first voltage level, and
in response to receiving a different second combination of drive signals at the two drive signal inputs, each SMPA branch is configured to produce, at the SMPA branch output, the SMPA branch output signal at a different second voltage level; and
a combiner with N combiner inputs and a combiner output, wherein each of the combiner inputs is coupled to a different one of the N SMPA branch outputs, and the combiner is configured to combine together the SMPA branch output signal from all of the N SMPA branches to produce, at the combiner output, a combined output signal, wherein the combined output signal may have, at any given time, one of 2*N+1 quantization states, wherein the combiner comprises:

N−1 summing nodes, wherein an output summing node of the N−1 summing nodes is coupled to the combiner output, and N−1 phase transformers, wherein each phase transformer is coupled to a summing node and is also coupled between SMPA branch outputs of a different set of two adjacent SMPA branches, and wherein the phase transformer is configured to apply a phase delay to the SMPA branch output signal from the SMPA branch that is electrically farther from the output summing node so that the SMPA branch output signals from the two adjacent SMPA branches combine in phase at the summing node to which the phase transformer is coupled.

18. A method, performed by an amplifier, for amplifying a time varying signal, the method comprising the steps of:

receiving an input RF signal;

sampling the input RF signal, resulting in a sequence of samples;

providing combinations of drive signals to each of a number, N, of switch-mode power amplifier (SMPA) branches of the amplifier, wherein N is greater than one, and wherein each SMPA branch includes two drive signal inputs, so that the amplifier has a total of 2*N drive signal inputs, and one SMPA branch output, so that the amplifier has a total of N SMPA branch outputs, and wherein the states of the drive signals at any given time depend on a magnitude of a sample in the sequence of samples;

in response to receiving a first combination of drive signals at the two drive signal inputs, producing, by each SMPA branch at the SMPA branch output, an SMPA branch output signal at a first voltage level; and in response to receiving a different second combination of drive signals at the two drive signal inputs, producing, by each SMPA branch at the SMPA branch output, the SMPA branch output signal at a different second voltage level.

19. The method of claim 18, further comprising:

quantizing each sample of the sequence of samples to produce a sequence of quantized digital values; and encoding each quantized digital value to produce a sequence of encoded values, and wherein the states of the drive signals at any given time depend on an encoded value of the sequence of encoded values that is being processed.

20. The method of claim 19, wherein:

each encoded value includes at least 2*N bits, each bit corresponds to a different one of the drive signals, and the value of each bit defines whether the drive signal to which the bit corresponds will have a first state, $S_{OFF}$, corresponding to a drive signal that will cause a transistor of an SMPA branch to which the drive signal is supplied to be substantially non-conducting, or a second state, $S_{ON}$, corresponding to a drive signal that will cause the transistor to operate in a saturation region, and each encoded value corresponds to a combination of drive signals which, for each of the SMPA branches, will cause the SMPA branch either to produce the SMPA branch output signal at the first voltage level, to produce the SMPA branch output signal at the second voltage level, or to produce the SMPA branch output signal at a third voltage level of substantially zero voltage.

21. The method of claim 18, further comprising:

combining together the SMPA branch output signal from all of the N SMPA branches to produce a combined output signal, wherein the combined output signal may have, at any given time, one of 2*N+1 quantization states.

* * * * *